United States Patent
Kim et al.

(10) Patent No.: US 11,512,389 B2
(45) Date of Patent: Nov. 29, 2022

(54) APPARATUS FOR AND METHOD OF MANUFACTURING SEMICONDUCTOR DEVICE

(71) Applicant: SAMSUNG ELECTRONICS CO., LTD., Suwon-si (KR)

(72) Inventors: Keewon Kim, Suwon-si (KR); Daehan Kim, Suwon-si (KR); Minkyung Lee, Suwon-si (KR)

(73) Assignee: SAMSUNG ELECTRONINCS CO., LTD., Suwon-si (KR)

(*) Notice: Subject to any disclaimer, the term of this patent is extended or adjusted under 35 U.S.C. 154(b) by 53 days.

(21) Appl. No.: 16/714,344

(22) Filed: Dec. 13, 2019

(65) Prior Publication Data

US 2020/0299829 A1 Sep. 24, 2020

(30) Foreign Application Priority Data

Mar. 20, 2019 (KR) .................. 10-2019-0032027
Jun. 25, 2019 (KR) .................. 10-2019-0075870

(51) Int. Cl.
| | |
|---|---|
| C23C 14/54 | (2006.01) |
| C23C 14/56 | (2006.01) |
| C23C 14/24 | (2006.01) |
| H01L 51/05 | (2006.01) |

(52) U.S. Cl.
CPC ............ *C23C 14/543* (2013.01); *C23C 14/24* (2013.01); *C23C 14/56* (2013.01); *H01L 51/0512* (2013.01)

(58) Field of Classification Search
CPC ...... C23C 14/543; C23C 14/24; C23C 14/246
See application file for complete search history.

(56) References Cited

U.S. PATENT DOCUMENTS

| | | | | |
|---|---|---|---|---|
| 4,535,235 A | * | 8/1985 | McIver, Jr. .......... | H01J 49/063 250/282 |
| 4,730,111 A | * | 3/1988 | Vestal ................ | G01N 30/7253 250/281 |
| 6,781,793 B2 | | 8/2004 | Kim et al. | |
| 6,987,276 B2 | | 1/2006 | Nakamura | |
| 7,122,790 B2 | | 10/2006 | Fonash et al. | |
| 7,744,965 B2 | | 6/2010 | Matsumoto et al. | |
| 9,691,999 B2 | | 6/2017 | Haman | |
| 10,121,969 B2 | | 11/2018 | Yamazaki et al. | |
| 10,153,141 B2 | * | 12/2018 | Yun ................... | H01J 37/32981 |

(Continued)

FOREIGN PATENT DOCUMENTS

| | | |
|---|---|---|
| JP | 2003004703 | 1/2003 |
| JP | 4174239 | 10/2008 |

(Continued)

*Primary Examiner* — John J Brayton
(74) *Attorney, Agent, or Firm* — F. Chau & Associates, LLC (57) ABSTRACT

Disclosed are an apparatus for and a method of manufacturing a semiconductor device. The apparatus includes a chamber, an evaporator that evaporates an organic source to provide a source gas on a substrate in the chamber, a vacuum pump that pumps the source gas and air from the chamber, an exhaust line between the vacuum pump and the chamber, and an analyzer connected to the exhaust line. The analyzer detects a derived molecule produced from the organic source and determines a replacement time of the evaporator.

11 Claims, 7 Drawing Sheets

(56) References Cited

U.S. PATENT DOCUMENTS

| | | | | |
|---|---|---|---|---|
| 2002/0155632 | A1* | 10/2002 | Yamazaki | C23C 14/568 438/29 |
| 2006/0255260 | A1* | 11/2006 | Ludviksson | H01J 37/32954 250/288 |
| 2007/0262252 | A1* | 11/2007 | Dowell | H01J 49/0468 250/282 |
| 2009/0014414 | A1* | 1/2009 | Tomioka | H01L 21/76814 216/41 |
| 2017/0022601 | A1 | 1/2017 | Dieguez-Campo et al. | |
| 2017/0152594 | A1 | 6/2017 | Yokoyama et al. | |
| 2018/0182652 | A1* | 6/2018 | Seshimo | H01L 21/67017 |
| 2018/0347039 | A1 | 12/2018 | Arnepalli et al. | |

FOREIGN PATENT DOCUMENTS

| | | |
|---|---|---|
| KR | 10-2003-0002090 | 1/2003 |
| KR | 10-0542243 | 1/2006 |

* cited by examiner

APPARATUS FOR AND METHOD OF MANUFACTURING SEMICONDUCTOR DEVICE

CROSS-REFERENCE TO RELATED APPLICATION

This U.S. nonprovisional application claims priority under 35 U.S.C. § 119 to Korean Patent Application Nos. 10-2019-0032027, filed on Mar. 20, 2019, and 10-2019-0075870, filed on Jun. 25, 2019, in the Korean Intellectual Property Office, the entire contents of which are hereby incorporated by reference.

TECHNICAL FIELD

The present disclosure relate to a semiconductor device, and more particularly, to an apparatus for manufacturing and a method of manufacturing a semiconductor device.

DISCUSSION OF THE RELATED ART

A complementary metal oxide semiconductor (CMOS) semiconductor device may typically include an integrated circuit in which complementary P-channel and N-channel transistors are formed on a common semiconductor substrate. The CMOS semiconductor device may be provided with a color filter formed of an organic thin film. An organic deposition apparatus may be used to form the organic thin film on the semiconductor substrate. The organic deposition apparatus may include an evaporator which evaporates an organic source. The evaporated organic source may be directly disposed on at the semiconductor substrate, or a showerhead may be used to dispense the evaporated organic source onto the semiconductor substrate.

SUMMARY

Some example embodiments of the present inventive concepts provide a semiconductor device manufacturing apparatus which is capable of determining a replacement time of an evaporator.

According to some example embodiments of the present inventive concepts, an apparatus for manufacturing a semiconductor device includes a chamber. An evaporator evaporates an organic source to provide a source gas on a substrate within the chamber. A vacuum pump pumps the source gas and air from the chamber. An exhaust line is disposed between the vacuum pump and the chamber. An analyzer is connected to the exhaust line. The analyzer detects a derived molecule produced from the organic source and determines a replacement time of the evaporator.

According to some example embodiments of the present inventive concepts, an apparatus for manufacturing a semiconductor device includes a chamber. An evaporator evaporates an organic source to provide a source gas into the chamber. A low vacuum pump pumps the source gas and air in the chamber at a first vacuum pressure. A high vacuum pump pumps the source gas and the air in the chamber at a second vacuum pressure that is greater than the first vacuum pressure. The high vacuum pump is disposed between the low vacuum pump and the chamber. A foreline connects the high vacuum pump to the chamber. An analyzer is disposed on the foreline. The analyzer detects a derived molecule produced from the organic source. A controller receives a detection signal of the derived molecule and obtains a partial pressure of the derived molecule. The controller outputs an interlock control signal to replace the evaporator when the partial pressure increases to a value equal to or greater than a reference partial pressure.

According to some example embodiments of the present inventive concepts, a method of manufacturing a semiconductor device includes heating an organic source in an evaporator to provide a source gas, on a substrate. The source gas, a derived molecule, and air are pumped through an exhaust line connected to a chamber. An analyzer is used to detect, the derived molecule. The analyzer is connected to the exhaust line. It is determined whether or not a partial pressure of the derived molecule is equal to or greater than a reference partial pressure.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

In describing exemplary embodiments of the present disclosure illustrated in the drawings, specific terminology is employed for sake of clarity. However, the present disclosure is not intended to be limited, to the specific terminology so selected, and it is to be understood that each specific element includes all technical equivalents which operate in a similar manner.

Figure 1:
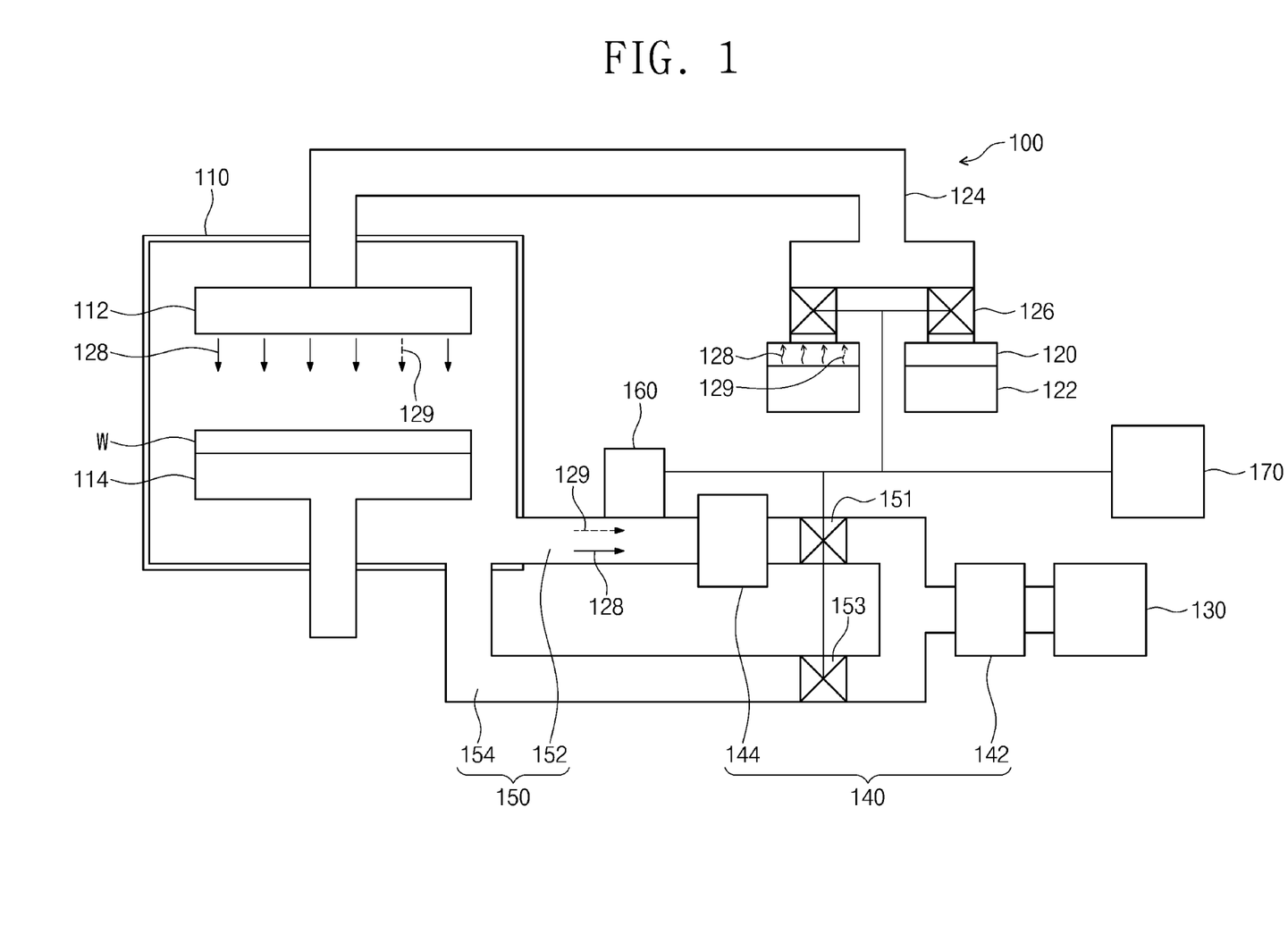
FIG. 1 is a schematic diagram illustrating a semiconductor device manufacturing apparatus according to some example embodiments of the present inventive concepts.

FIG. 1 is a schematic diagram illustrating a semiconductor device manufacturing apparatus 100 according to some example embodiments of the present inventive concepts.

Referring to FIG. 1, the semiconductor device manufacturing apparatus 100 may include a physical vapor deposition (PVD) apparatus or an organic deposition apparatus. Alternatively, the semiconductor device manufacturing apparatus 100 may include a chemical vapor deposition (CVD) apparatus or a sputter, but the present inventive concepts are not limited thereto and other means of deposition may be used. The semiconductor device manufacturing apparatus 100 may include, for example, a chamber 110, an evaporator 120, an exhauster 130, a vacuum pump 140, an exhaust line 150, an analyzer 160, and a controller 170. As used herein, the evaporator 120 may be understood to be a device configured to evaporate a material from a solid form to a gaseous form by applying heat to the material in solid form. Thus, the evaporator may be embodied as a heating element. As used herein, the exhauster 130 may be understood to be a device configured to release or ventilate evaporated particles and other gasses to the outside. Thus, the exhauster, may be a vent or port. As used herein, the analyzer 160 may be embodied as a computer device, system-on-chip, or some other digital processor in conjunction with one or more sensors. As used herein, the controller 170 may be embodied as a computer device, system-on-chip, or some other digital processor.

The chamber 110 may hermetically seal a substrate W from the outside. For example, the chamber 110 may have a showerhead 112 and a susceptor 114. The showerhead 112 may be disposed in an upper portion of the chamber 110. The susceptor 114 may be placed in a lower portion of the chamber 110. The showerhead 112 may provide the substrate W with a source gas 128 to deposit an organic thin film. The susceptor 114 may receive the substrate W thereon. The susceptor 114 may include a heater plate which heats the substrate W.

The evaporator 120 may be connected to the showerhead 112 of the chamber 110. The evaporator 120 may evaporate an organic source 122 (e.g. an organic source material in solid form) to provide the source gas 128 to the showerhead 112. Alternatively, the evaporator 120 may be disposed within the chamber 110. For example, the evaporator 120 may include a crucible or an evaporation boat. The evaporator 120 may heat the organic source 122 to a high temperature of about 300° C. to produce the source gas 128. The organic source 122 may be evaporated and provided into the chamber 110. When the organic source 122 is entirely evaporated in the evaporator 120, the evaporator 120 may be replaced with an evaporator 120 having a new source 122.

In addition, during an idle time, the evaporator 120 may preliminarily heat the organic source 122 to temperatures between 200° C. and 250° C. so that the organic source 122 does not evaporate but is more ready to evaporate when in use. The organic source 122 may be thermally degraded either in the evaporator 120 or in a gas supply line 124 which will be discussed below, with the result that a derived molecule (or derivative) 129 may be induced. The derived molecule 129 may have a chemical composition that is different from that of the source gas 128. Each of the organic source 122 and the source gas 128 may have a molecular weight equal to or greater than about 300. For example, each of the organic source 122 and the source gas 128 may have a molecular weight of about 400 to about 1500. The derived molecule 129 may be lighter than the source gas 128. The derived molecule 129 may have a molecular weight of about 50 to about 250. For example, the derived molecule 129 may include anthracene, carbazole, thiophene, and/or aniline. The presence of the derived molecule 129 may increase a pressure of the chamber 110, and thus may cause failure of an organic deposition process. When it is determined that the derived molecule 129 is produced in large quantity, the evaporator 120 may be replaced.

A gas supply line 124 and a gas supply valve 126 may be provided between the evaporator 120 and the chamber 110. The source gas 128 may be provided through the gas supply line 124 to the showerhead 112. The gas supply line 124 may be heated to a high temperature of about 250° C. to prevent the source gas 128 from being adsorbed. The gas supply valve 126 may be installed on the gas supply line 124, adjacent to the evaporator 120. The gas supply valve 126 may switch the supply of the source gas 128 on and off.

The exhauster 130 may be connected to the lower portion of the chamber 110. The exhauster 130 may exhaust the source gas 128 and air from the chamber 110. For example, the exhauster 130 may include a scrubber. The exhauster 130 may purge the source gas 128.

The vacuum pump 140 may be installed between the exhauster 130 and the chamber 110. The vacuum pump 140 may pump the source gas 128 and air from the chamber 110. For example, the vacuum pump 140 may include a low vacuum pump 142 and a high vacuum pump 144. The low vacuum pump 142 and the high vacuum pump 144 may be connected in series. The low vacuum pump 142 may be configured to provide a lower vacuum pressure than the high vacuum pump 144.

The low vacuum pump 142 may be connected between the high vacuum pump 144 and the exhauster 130. The low vacuum pump 142 may be configured such the source gas 128 and air in the chamber 110 is pumped at a low vacuum pressure of about $1.0 \times 10^{-3}$ Torr. The low vacuum pump 142 may include a dry pump or a rotary pump.

The high vacuum pump 144 may be connected between the low vacuum pump 142 and the chamber 110. The high vacuum pump 144 may be configured such that the source gas 128 and air in the chamber 110 are pumped at a high vacuum pressure of about $1.0 \times 10^{-6}$ Torr. The high vacuum pump 144 may include a cryo pump or turbo pump.

The exhaust line 150 may connect the exhauster 130 to the chamber 110. The exhaust line 150 may be connected to the low and high vacuum pumps 142 and 144 of the vacuum pump 140. The low vacuum pump 142 may be disposed adjacent to the exhauster 130, and the high vacuum pump 144 may be disposed adjacent to the chamber 110. For example, the exhaust line 150 may include a foreline 152 and a roughing line 154.

The foreline 152 may allow the high vacuum pump 144 to have a serial connection between the chamber 110 and the low vacuum pump 142. A forcible valve 151 may be provided between the high vacuum pump 144 and the low vacuum pump 142. Alternatively, the foreline valve 151 may be installed on the foreline 152 between the chamber 110 and the high vacuum pump 144, but the present inventive concepts are not limited thereto.

The roughing line 154 may directly connect the low vacuum pump 142 to the chamber 110, and thus nay bypass the high vacuum pump 144. For example, the foreline 152 and the roughing line 154 may be connected in parallel between the chamber 110 and the low vacuum pump 142. The high vacuum pump 144 may be connected to the foreline 152. A roughing valve 153 may be provided on the roughing line 154. The roughing valve 153 may be switched opposite to the foreline valve 151. When air is initially pumped from chamber 110, the roughing valve 153 may be opened, and the foreline valve 151 may be closed. When the roughing valve 153 is opened and the foreline valve 151 is closed, the low vacuum pump 142 may operate such that air is pumped at a low vacuum pressure from the chamber 110. Afterwards, the roughing valve 153 may be closed, and the foreline valve 151 may be opened. When the roughing valve 153 is closed and the foreline valve 151 is opened, the high vacuum pump 144 may operate such that air is pumped at a high vacuum pressure from the chamber 110.

Figure 2:
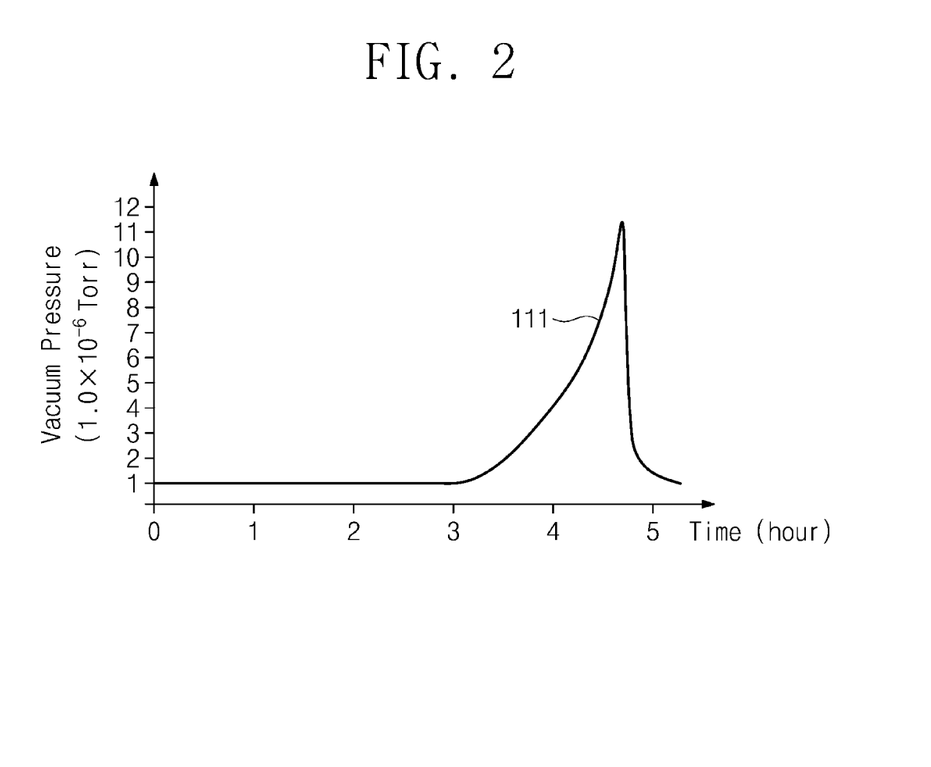
FIG. 2 is a graph illustrating a pressure of a chamber depicted in FIG. 1.

FIG. 2 is a graph illustrating a pressure 111 of the chamber 110 illustrated in FIG. 1.

Referring to FIG. 2, the pressure 111 of the chamber 110 may come to a point of a rapid increase with usage time of the evaporator 120. When the evaporator 120 is used for an initial time duration (e.g., about 3 hours or less), the pressure 111 of the chamber 110 may be uniformly maintained at about $1.0 \times 10^{-6}$ Torr. After the initial usage time of the evaporator 120 (e.g., after about 3 hours or more), the pressure 111 of the chamber 110 may more quickly increase from about $1.0 \times 10^{-6}$ Torr to about $1.0 \times 10^{-5}$ Torr. After the evaporator 120 is replaced, the pressure 111 of the chamber 110 may decrease back to about $1.0 \times 10^{-6}$ Torr.

Referring again to FIG. 1, the analyzer 160 may be connected to the foreline 152 between the high vacuum pump 144 and the chamber 110. The analyzer 160 may detect the presence and/or quantity of and/or otherwise analyze the derived molecule 129 of the source gas 128, and then determine a replacement time of the evaporator 120. For example, the analyzer 160 may include a residual gas analyzer or a time-of-flight mass spectrometer.

Figure 3:
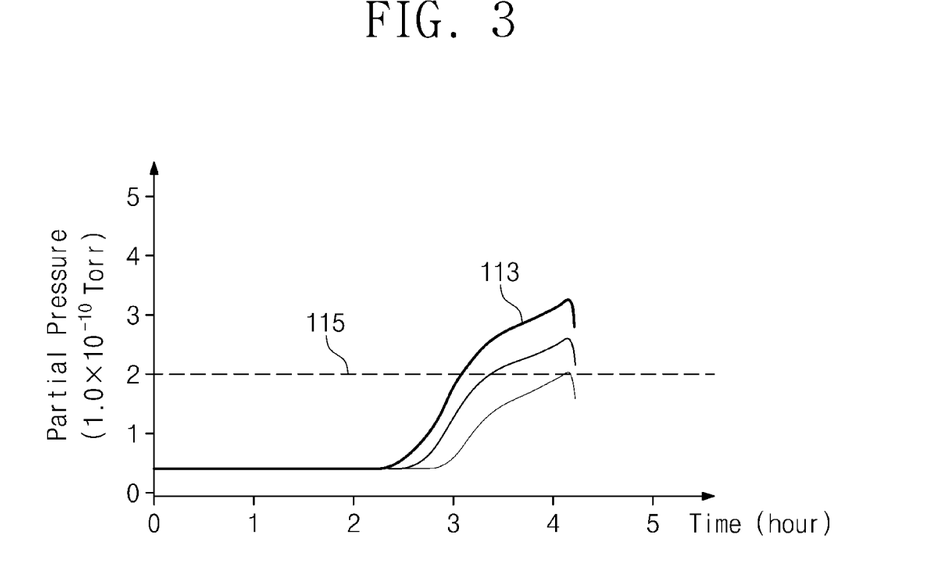
FIG. 3 is a graph illustrating a partial pressure of a derived molecule detected in an analyzer depicted in FIG. 1.

FIG. 3 is a graph illustrating a partial pressure 113 of the derived molecule 129 illustrated in FIG. 1 and a reference partial pressure 115.

Referring to FIG. 3, the analyzer 160 may measure the partial pressure 113 of the derived molecule 129. The partial pressure 113 may be equal to or less than about $1.0 \times 10^{-10}$ Torr when the evaporator 120 is initially used. After the evaporator 120 is used, degradation of the organic source 122 may cause the partial pressure 113 to increase to a value equal to or greater than the reference partial pressure 115. The reference partial pressure 115 may be, for example, about $2.0 \times 10^{-10}$ Torr. When the partial pressure 113 increases to a value equal to or greater than the reference partial pressure 115, the evaporator 120 may be replaced. Therefore, the analyzer 160 may detect the derived molecule 129 to determine the replacement time of the evaporator 120.

Referring to FIGS. 2 and 3, the partial pressure 113 of the derived molecule 129 may be proportional to the pressure 111 of the chamber 110. When the pressure 111 of the chamber 110 increases, the partial pressure 113 of the derived molecule 129 may increase to a value equal to or greater than the reference partial pressure 115. Therefore, then analyzer 160 may measure the derived molecule 129 to determine an increase in the pressure 111 of the chamber 110 or a cause of the increase in the pressure 111 of the chamber 110. In addition, the analyzer 160 may determine a kind of the derived molecule 129. The partial pressure 113 may be different based on the kind of the derived molecule 129.

Figure 4:
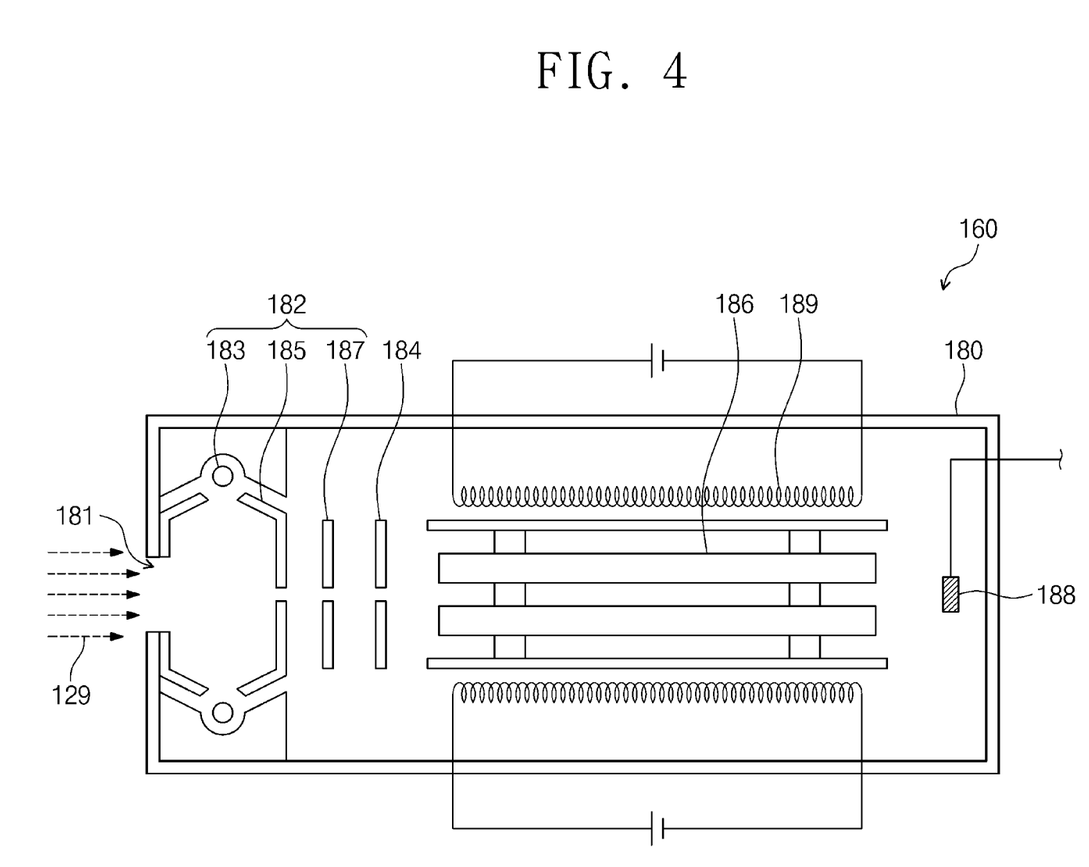
FIG. 4 is a schematic diagram illustrating an example of an analyzer illustrated in FIG. 1.

FIG. 4 is a schematic diagram illustrating an example of the analyzer 60 illustrated in FIG. 1.

Referring to FIG. 4, the analyzer 160 may include a housing 180, a first ionizer 182, an aperture 184, a mass filter 186, and a detector 188. The detector 188 may be embodied as one or more sensors.

The housing 18 may have an inlet 181. The inlet 181 may be connected to the foreline 152. The derived molecule 129 may be introduced through the inlet 181 into the housing 180.

The first ionizer 182 may be disposed in the housing 180. The first ionizer 182 may ionize the derived molecule 129. The first ionizer 182 may include a filament 183, a faraday cup 185, and an acceleration electrode 187. The filament 183 may provide the derived molecule 129 with an electron beam to charge the derived molecule 129. The faraday cup 185 may be placed between the filament 183 and the acceleration electrode 187. The faraday cup 185 may protect the charged derived molecule 129 from the outside. The acceleration electrode 187 may be disposed between the faraday cup 185 and the aperture 184. The acceleration electrode 187 may accelerate the charged derived molecule 129. The derived molecule 129 may be provided to the aperture 184 and the mass filter 186.

The aperture 184 may be disposed between the acceleration electrode 187 and the mass filter 186. The aperture 184 may focus the accelerated derived molecule 129 on the mass filter 186. Alternatively, the aperture 184 may adjust a flow rate of the derived molecule 129, but the present inventive concepts are not limited thereto.

The mass filter 186 may be disposed between the aperture 184 and the detector 188. For example, the mass filter 186 may include a quadrupole mass filter. The mass filter 186 may be configured to filter impurities and to allow the derived molecule 129 to pass therethrough. For example, the mass filter 186 may electrostatically filter impurities that are lighter than the derived molecule 129. For example, the mass filter 186 may filter impurities that are heavier than the derived molecule 129. A first heater 189 may be provided outside the mass filter 186. The first heater 189 may be disposed between an inner wall of the housing 180 and an outer wall of the mass filter 186. The first heater 189 may heat and clean the mass filter 186.

The housing 180 may be provided with the detector 188 on its sidewall opposite to the inlet 181. The detector 188 may detect the derived molecule 129. For example, the detector 188 may include a collector electrode.

Referring once more to FIG. 1, the controller 170 may be connected to the gas supply valve 126, the foreline valve 151, the roughing valve 153, and the analyzer 160. The controller 170 may control the gas supply valve 126, the foreline valve 151, and the roughing valve 153. The controller 170 may use detection signals from the detector 188 of the analyzer 160, and may analyze the derived molecule 129. For example, the controller 170 may count the number of derived molecules 129 per unit time, and then may obtain the partial pressure 113 of the derived molecule 129. Based on detection results of the derived molecule 129, the controller 170 may monitor the pressure 111 of the chamber 110. The controller 170 may determine the kind of the derived molecule 129. When the partial pressure 113 of the derived molecule 129 increases, the controller 170 may output an interlock control signal to replace the evaporator 120.

Figure 5:
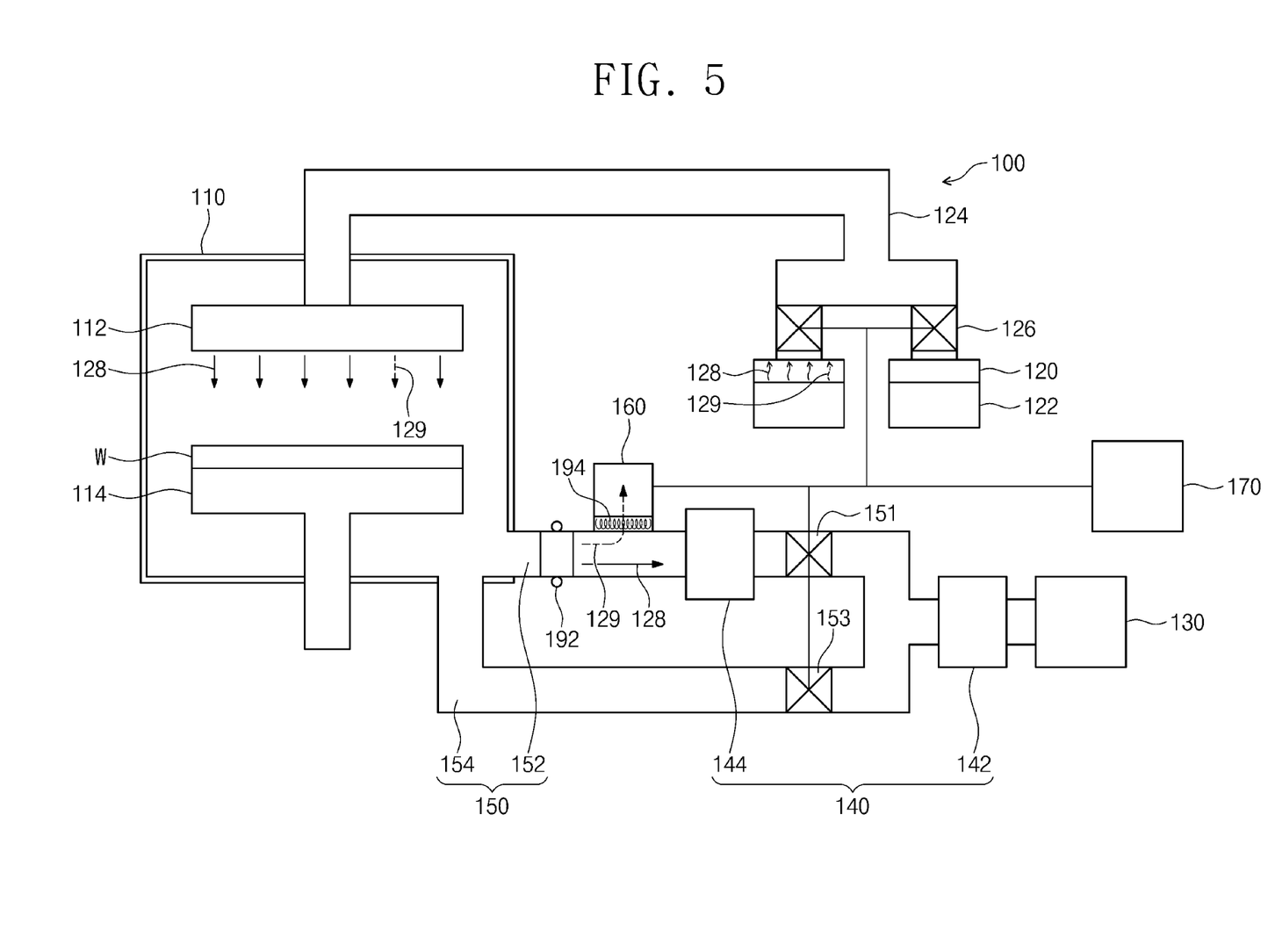
FIG. 5 is a schematic diagram illustrating a semiconductor device manufacturing apparatus according to some example embodiments of the present inventive concepts.

FIG. 5 is a schematic diagram illustrating an example of the semiconductor device manufacturing apparatus 100 according to the present inventive concepts.

Referring to FIG. 5, the semiconductor device manufacturing apparatus 100 may further include a second ionizer 192 and a magnet 194. The second ionizer 192 and the magnet 194 may increase efficiency in detection of the derived molecule 129.

The second ionizer 192 may be connected to the foreline 152 between the chamber 110 and the high vacuum pump 144. The second ionizer 192 may charge the source gas 128 and the derived molecule 129.

The magnet 194 may be disposed between the second ionizer 192 and the analyzer 160. In addition, the magnet 194 may be connected between the foreline 152 and the analyzer 160. The magnet 194 may use an electromagnetic field to selectively extract the derived molecule 129, and then may provide the analyzer 160 with the extracted derived molecule 129. The magnet 194 may filter the source gas 128, whose mass is different from that of the derived molecule 129. For example, the source gas 128, that is relatively heavy, may be pumped from the second ionizer 192 to the high vacuum pump 144, and the derived molecule 129, that is relatively light, may be extracted through the magnet 194.

The chamber 110, the evaporator 120, the exhauster 130, the vacuum pump 140, the exhaust line 150, the analyzer 160, and the controller 170 may be configured identically or similarly to those shown in FIG. 1.

Figure 6:
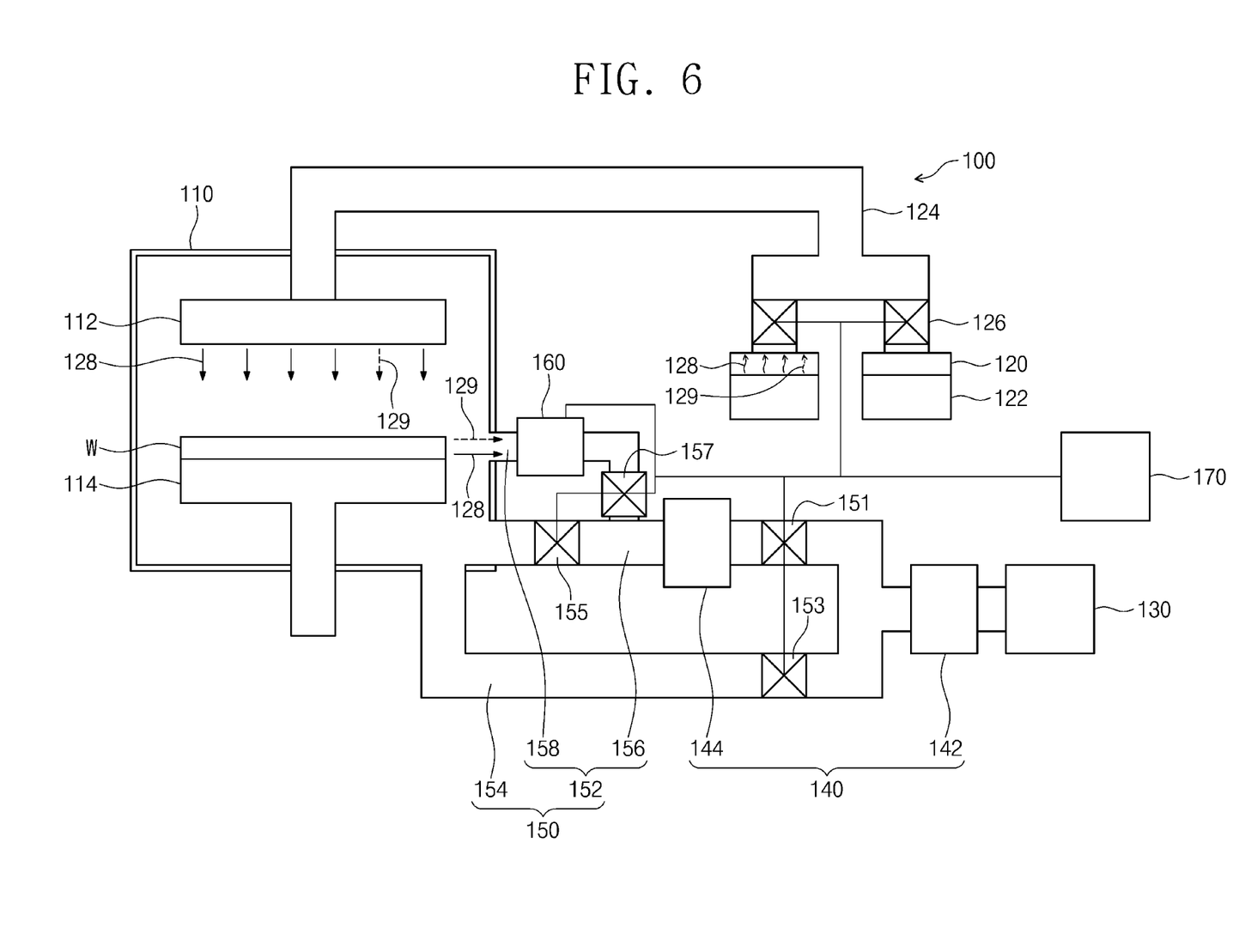
FIG. 6 is a schematic diagram illustrating a semiconductor device manufacturing apparatus according to some example embodiments of the present inventive concepts.

FIG. 6 is a schematic diagram illustrating an example of the semiconductor device manufacturing apparatus 100 according to the present inventive concepts.

Referring to FIG. 6, the semiconductor device manufacturing apparatus 100 may be configured such that the foreline 152 includes a first foreline 156 and a second foreline 158. The first foreline 156 and the second foreline 158 may be connected in parallel between the chamber 110 and the high vacuum pump 144.

The first foreline 156 may directly connect the high vacuum pump 144 to the chamber 110. A second foreline valve 155 may be installed on the first foreline 156 between the chamber 110 and the high vacuum pump 144. The second foreline valve 155 may permit or interrupt the flow of the source gas 128, the derived molecule 129 and air in the first foreline 156.

The second foreline 158 may allow the analyzer 160 to have a serial connection between the chamber 110 and the high vacuum pump 144. The second foreline 158 may be used as a measurement line for the derived molecule 129. A third foreline valve 157 may be installed on the second foreline 158 between the analyzer 160 and the high vacuum pump 144. When the third foreline valve 157 is opened at regular intervals, the analyzer 160 may detect the derived molecule 129. When the second foreline valve 155 is closed, the third foreline valve 157 may be opened. When the third foreline valve 157 is opened, the analyzer 160 may detect the derived molecule 129.

The chamber 110, the evaporator 120, the exhauster 130, the vacuum pump 140, the roughing line 154, and the controller 170 may be configured identically or similarly to those shown in FIG. 1.

Figure 7:
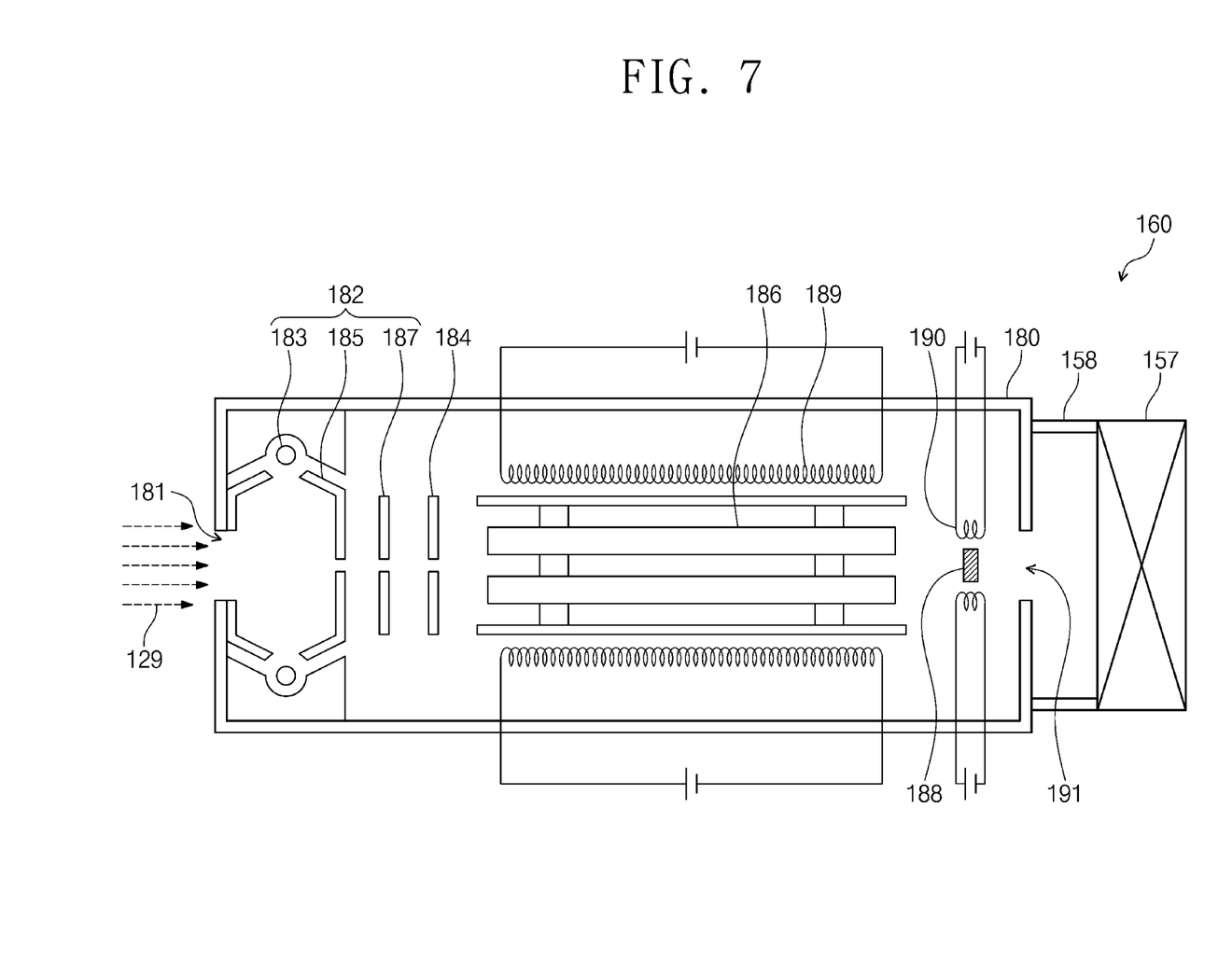
FIG. 7 is a schematic diagram illustrating an analyzer of FIG. 4.

FIG. 7 is a schematic diagram illustrating an example of the analyzer 160 illustrated in FIG. 4.

Referring to FIG. 7, the housing 180 of the analyzer 160 may have an inlet 181 and an outlet 191 that are connected in series to the second foreline 158. The inlet 181, the aperture 184, and the outlet 191 may all be aligned in one direction. The outlet 191 may be connected to the second foreline 158 between the housing 180 and the third foreline valve 157. The outlet 191 may thus be connected to the high vacuum pump 144. The derived molecule 129 may be introduced through the inlet 181 into the housing 180, and may be discharged through the outlet 191 from the housing 180. The mass filter 186 may filter the source gas 128. The outlet 191 may raise a flow rate of the derived molecule 129 in the housing 180, and thus the detector 188 may increase efficiency in detection of the derived molecule 129. A second heater 190 may be disposed adjacent to the detector 188. The second heater 190 may be disposed between the detector 188 and the inner wall of the housing 180. The second heater 190 may heat and clean the detector 188.

The first ionizer 182, the aperture 184, the mass filter 186, and the first heater 189 of the analyzer 160 may be configured identically or similarly to those shown in FIG. 4.

The following describes a semiconductor device manufacturing method using the semiconductor device manufacturing apparatus 100 configured as described above.

Figure 8:
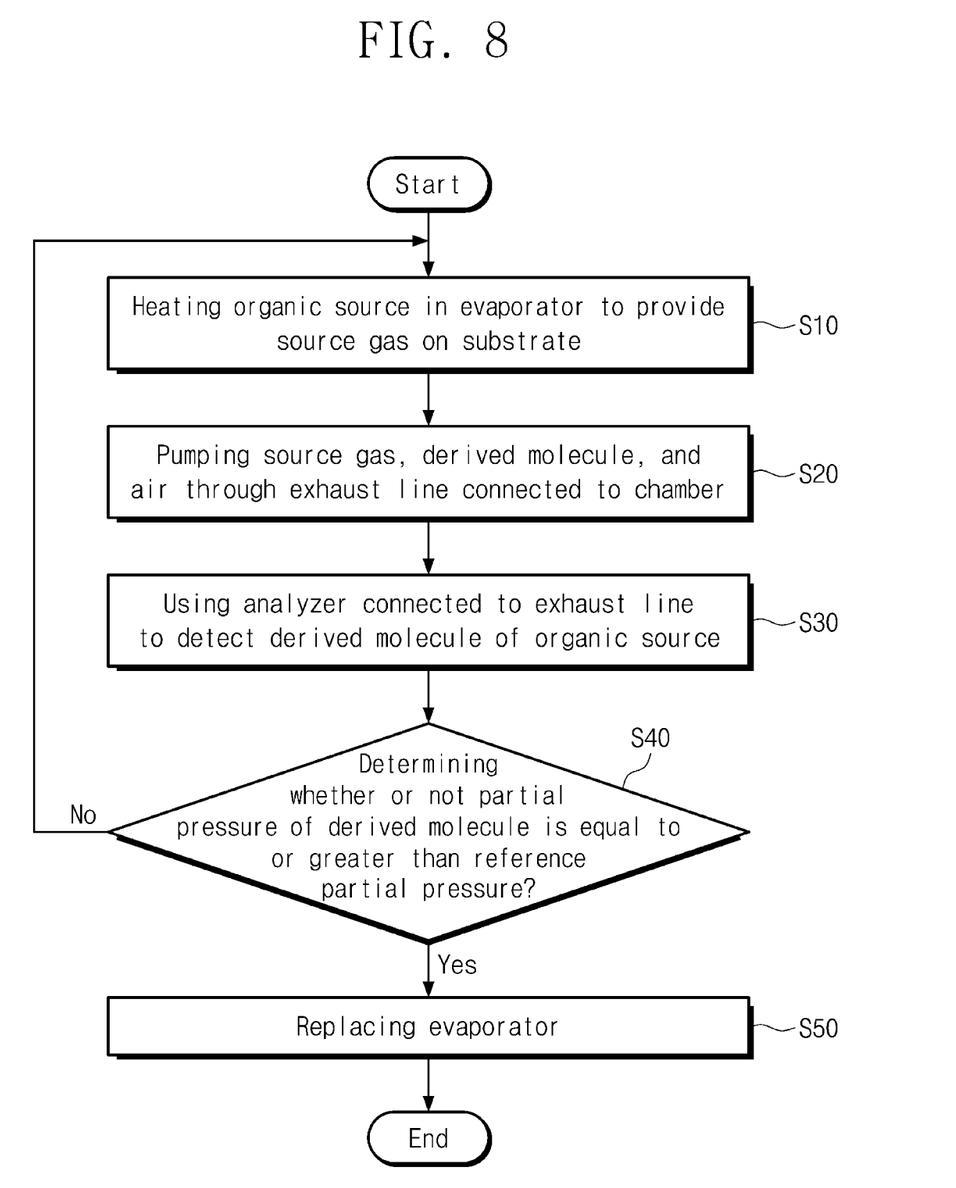
FIG. 8 is a flow chart illustrating a method of manufacturing a semiconductor device according to some example embodiments of the present inventive concepts.

FIG. 8 is a flow chart illustrating a method of manufacturing a semiconductor device according to some example embodiments of the present inventive concepts.

Referring to FIG. 8, a semiconductor device manufacturing method may include heating the organic, source 122 in the evaporator 120 to provide the source gas 128 on the substrate W in the chamber 110 (S10), pumping the source gas 128, the derived molecule 129, and air through the exhaust line 150 connected to the chamber 110 (S20), detecting the derived molecule 129 of the organic source 122 using the analyzer 160 connected to the exhaust line 150 (S30), determining whether or not the partial pressure 113 of the derived molecule 129 is equal to or greater than the reference partial pressure 115 (S40), and replacing the evaporator 120 (S50).

At the step S10, the evaporator 120 may heat the organic source 122 to provide the source gas 128 on the substrate W in the chamber 110. The evaporator 120 may heat the organic source 122 to a high temperature equal to or greater than about 300° C. to produce the source gas 128. The organic source 122 may have a molecular weight equal to or greater than about 300. For example, the organic source 122 may have a molecular weight of about 400 to about 1500. The source gas 128 may be dispensed through the showerhead 112 onto the substrate W. The substrate W may be provided thereon with the source gas 128 to form an organic thin film. When the evaporator 120 heats the organic source 122 for a certain time or more, the organic source 122 may create the derived molecule 129. The derived molecule 129 may have a molecular weight of about 50 to about 250. For example, the derived molecule 129 may include anthracene, carbazole, thiophene, or aniline. The derived molecule 129 may be provided on the substrate W. The derived molecule 129 may be exhausted through the chamber 110 and the exhaust line 150, without depositing an organic thin film.

At the step S20, the vacuum pump 140 may operate such that the source gas 128, the derived molecule 129, and air are pumped through the exhaust line 150 from the chamber 110. The chamber 110 may have a high vacuum pressure of about $1.0 \times 10^{-6}$ Torr.

At the step S30, the analyzer 160 may detect the derived molecule 129 in the exhaust line 150. The analyzer 160 may measure the derived molecule 129 at a regular time intervals (e.g., at one hour intervals). In addition, the analyzer 160 may measure the derived molecule 129 based on a molecular weight of the derived molecule 129.

At the step S40, the controller 170 may determine whether or not the partial pressure 113 of the measured derived molecule 129 is equal to or greater than the reference partial pressure 115. The controller 170 may count the number of derived molecules 129 per unit time, and then may obtain the partial pressure 113 of the derived molecule 129. When the evaporator 120 is initially used, the partial pressure 113 may be less than the reference partial pressure 115. After the evaporator 120 is used for a certain length of time, the partial pressure 113 may increase to a value equal to or greater than the reference partial pressure 115. The controller 170 may periodically acquire the partial pressure 113 of the derived molecule 129, and may compare the partial pressure 113 and the reference partial pressure 115 with each other to monitor an organic thin-film deposition process. In addition, the controller 170 may measure a molecular weight of the derived molecule 129 and then may determine a kind of the derived molecule 129.

When the partial pressure 113 of the derived molecule 129 is less than the reference partial pressure 115, the steps S10 to S40 may be repeatedly performed.

At the step S50, when the partial pressure 113 of the derived molecule 129 increases to a value equal to or greater than the reference partial pressure 115, the controller 170 may output an interlock control signal to replace the evaporator 120. When the interlock control signal is output, an operator or a replacement tool may replace the evaporator 120.

As discussed above, a semiconductor device manufacturing apparatus according to some example embodiments of the present inventive concepts may be configured such that an analyzer between a chamber and a vacuum pump is used to detect a derived molecule of an organic source and to determine a replacement time of an evaporator.

Although exemplary embodiments of the present invention have been described in connection with the accompanying drawings, it will be understood to those skilled in the art that various changes and modifications may be made without departing from the present disclosure.

What is claimed is:

1. An apparatus for manufacturing a semiconductor device, the apparatus comprising:
  a chamber having a chuck in a lower portion of the chamber and a showerhead in an upper portion of the chamber;
  an evaporator disposed outside of the chamber and connected to the showerhead, the evaporator evaporating an organic source to produce a source gas and providing the source gas to a substrate within the chamber;
  a vacuum pump pumping the source gas and air from the chamber, the vacuum pump including a low vacuum pump and a high vacuum pump generating a higher level of vacuum than the low vacuum pump;
  an exhaust line establishing a fluid path between the vacuum pump and the chamber, the exhaust line including a roughing line between the low vacuum pump and a foreline connecting the high vacuum pump and the low vacuum pump to the chamber sequentially, the roughing line bypassing the high vacuum pump;
  a first foreline valve coupled with the foreline between the high vacuum pump and the low vacuum pump;
  a second foreline valve coupled with the foreline between the high vacuum pump and the chamber;
  a roughing valve coupled with the roughing line;
  an analyzer connected to the exhaust line, the analyzer detecting a derived molecule produced from the organic source and determining a time to replace the evaporator,
  wherein the foreline comprises:
    a first foreline connected to the chamber, the second foreline valve, the high vacuum pump, and the first foreline valve; and
    a second foreline branched from the first foreline between the second foreline valve and the high vacuum pump, the second foreline connected to the chamber,
  wherein the apparatus further comprises a third foreline valve coupled with the second foreline, and
  wherein the analyzer connects the vacuum pump and the chamber in series, the analyzer coupled with the second foreline between the third foreline valve and the chamber.

2. The apparatus of claim 1, wherein the analyzer includes a residual gas analyzer or a time-of-flight mass spectrometer.

3. The apparatus of claim 2, wherein the analyzer includes:
  a housing having an inlet through which the derived molecule is introduced;
  a detector in the housing, the detector detecting the derived molecule;
  a first ionizer disposed between the detector and the inlet, the first ionizer applying an ionizing charge to the derived molecule;
  a mass filter disposed between the first ionizer and the detector, the mass filter filtering impurities of the derived molecule; and
  an aperture disposed between the first ionizer and the mass filter.

4. The apparatus of claim 3, wherein the housing further includes an outlet disposed between the detector and the vacuum pump, wherein the inlet, the aperture, and the outlet are all aligned in one direction.

5. The apparatus of claim 3, wherein the analyzer further includes:
  a first heater disposed between an inner wall of the housing and an outer wall of the mass filter, the first heater heating the mass filter; and
  a second heater disposed between the inner wall of the housing and the detector, the second heater heating the detector.

6. The apparatus of claim 1, further comprising:
  a second ionizer disposed on the exhaust line between the chamber and the vacuum pump, the second ionizer charging the source gas and the derived molecule; and
  a magnet disposed between the analyzer and the exhaust line, adjacent to the second ionizer, the magnet selectively extracting the derived molecule in the exhaust line and providing the analyzer with the extracted derived molecule.

7. The apparatus of claim 1, further comprising a controller outputting an interlock control signal to replace the evaporator when a partial pressure of the derived molecule in the chamber increases to a predetermined level.

8. An apparatus for manufacturing, a semiconductor device, the apparatus comprising:
  to chamber having a chuck in a lower portion of the chamber and a showerhead in an upper portion of the chamber;
  an evaporator disposed outside of the chamber and connected to the showerhead, the evaporator evaporating an organic source to produce a source gas and providing the source gas into the chamber;
  a low vacuum pump pumping the source gas and air in the chamber at a first vacuum pressure;
  a high vacuum pump pumping the source gas and the air in the chamber at a second vacuum pressure that is greater than the first vacuum pressure, the vacuum pump being disposed between the low vacuum pump and the chamber;
  a foreline connecting the high vacuum pump to the chamber and to the low vacuum pump;
  a first foreline valve coupled with the foreline between the high vacuum pump and the low vacuum pump;
  a second foreline valve coupled with the foreline between the high vacuum pump and the chamber;
  a roughing line connected between the low vacuum pump the roughing line bypassing the high vacuum pump;
  a roughing valve coupled with the roughing line;
  an analyzer disposed on the foreline, the analyzer detecting a derived molecule produced from the organic source; and
  a controller receiving a detection signal of the derived molecule to obtain a partial pressure of the derived molecule, the controller outputting an interlock control signal to replace the evaporator when the partial pressure increases to a predetermined value that is equal to or greater than a reference partial pressure, wherein the foreline comprises:
- a first foreline connected to the chamber the second foreline valve, the high vacuum pump chamber, the first foreline valve, and the low vacuum pump; and
- a second foreline branched from the first foreline between the second foreline valve and the high vacuum pump, the second foreline connected to the chamber, wherein the apparatus further comprises a third foreline valve coupled with the second foreline, and wherein the analyzer connects the high vacuum pump to the chamber in series and is coupled with the second foreline between the third foreline valve and the chamber.

9. The apparatus of claim 8, further comprising:
an ionizer connected to the foreline and disposed between the chamber and the analyzer; and
a magnet filtering the source gas in the foreline, the magnet selectively extracting the derived molecule and providing the analyzer with the extracted derived molecule.

10. The apparatus of claim 8, wherein the analyzer includes:
- a detector detecting the derived molecule;
- a mass filter filtering impurities of the derived molecule; and
- a housing enveloping the detector and the mass filter, the housing having an inlet through which the derived molecule is introduced and an outlet through which the derived molecule is exhausted, the outlet being arranged opposite to the inlet.

11. The apparatus of claim 10, wherein the analyzer further includes an aperture disposed between the mass filter and the inlet, wherein the inlet, the aperture, and the outlet are all aligned in one direction.

* * * * *